United States Patent
Arfsten et al.

(10) Patent No.: US 9,605,156 B2
(45) Date of Patent: Mar. 28, 2017

(54) INORGANIC OXIDE COATING

(75) Inventors: Nanning Joerg Arfsten, Geleen (NL); Roberto Arnoldus Dominicus Maria Habets, Geleen (NL); Pascal Jozef Paul Buskens, Geleen (NL)

(73) Assignee: DSM IP ASSETS B.V., Heerlen (NL)

( * ) Notice: Subject to any disclaimer, the term of this patent is extended or adjusted under 35 U.S.C. 154(b) by 503 days.

(21) Appl. No.: 13/805,159

(22) PCT Filed: Jun. 17, 2011

(86) PCT No.: PCT/EP2011/060106
§ 371 (c)(1),
(2), (4) Date: Mar. 4, 2013

(87) PCT Pub. No.: WO2011/157820
PCT Pub. Date: Dec. 22, 2011

(65) Prior Publication Data
US 2013/0202895 A1    Aug. 8, 2013

(30) Foreign Application Priority Data
Jun. 18, 2010   (EP) .................................... 10166452

(51) Int. Cl.
| | | |
|---|---|---|
| *C09D 1/00* | (2006.01) | |
| *C03C 17/00* | (2006.01) | |
| *C08G 77/58* | (2006.01) | |
| *C09D 183/14* | (2006.01) | |
| *G02B 1/113* | (2015.01) | |
| *H01L 31/0216* | (2014.01) | |

(52) U.S. Cl.
CPC .............. *C09D 1/00* (2013.01); *C03C 17/007* (2013.01); *C08G 77/58* (2013.01); *C09D 183/14* (2013.01); *G02B 1/113* (2013.01); *H01L 31/02168* (2013.01); *C03C 2217/42* (2013.01); *C03C 2217/425* (2013.01); *C03C 2217/732* (2013.01); *Y02E 10/50* (2013.01)

(58) Field of Classification Search
CPC ...... C09D 1/00; C03C 17/007; C03C 2217/42
USPC ............................... 106/122, 286.1; 427/162
See application file for complete search history.

(56) References Cited

U.S. PATENT DOCUMENTS

| | | | | |
|---|---|---|---|---|
| 5,492,957 A | * | 2/1996 | Nishikawa et al. | ........... 524/430 |
| 6,750,270 B1 | * | 6/2004 | Klostermann et al. | ....... 523/200 |
| 2009/0246114 A1 | | 10/2009 | Sah et al. | |
| 2010/0297430 A1 | * | 11/2010 | Thies et al. | ................... 428/323 |

FOREIGN PATENT DOCUMENTS

| | | |
|---|---|---|
| CN | 101421022 A | 4/2009 |
| WO | WO 2007093341 A1 * | 8/2007 |
| WO | WO 2010/043653 | 4/2010 |

OTHER PUBLICATIONS

International Search Report for PCT/EP2011/060106 mailed Oct. 27, 2011.

* cited by examiner

*Primary Examiner* — Kaj K Olsen
*Assistant Examiner* — Alexander Polyansky
(74) *Attorney, Agent, or Firm* — Nixon & Vanderhye P.C.

(57) ABSTRACT

The invention relates to a coating composition comprising an inorganic oxide precursor $A_{MOx}$ based on at least one inorganic element A selected from the group consisting of aluminum, silicium, titanium, zirconium, niobium, indium, tin, antimony, tantalum, and bismuth; and an inorganic oxide precursor $B_{MOx}$ based on at least one inorganic element B selected from the group consisting of scandium, yttrium, lanthanum, and the lanthanoids; wherein $A_{MOx}$ and $B_{MOx}$ are capable of forming a mixed inorganic oxide. A coating made from this composition shows enhanced resistance to hydrolysis. The invention also relates to a process for applying a coating on a substrate using such composition, more specifically to a liquid coating composition for use in a process of applying an anti-reflective coating on transparent substrate; to a coated substrate obtained with such process, and to an article, like a solar panel, comprising such coated substrate.

11 Claims, No Drawings

INORGANIC OXIDE COATING

This application is the U.S. national phase of International Application No. PCT/EP2011/060106 filed 17 Jun. 2011 which designated the U.S. and claims priority to EP 10166452.2 filed 18 Jun. 2010, the entire contents of each of which are hereby incorporated by reference.

FIELD

The invention relates to an inorganic oxide coating composition and to process for applying a coating on a substrate using such composition, more specifically to a liquid coating composition for use in a process of applying an anti-reflective coating on transparent substrate. The invention also relates to a coated substrate obtained with such process, more specifically to a coated transparent substrate showing certain maximum light reflection; and to an article, like a solar panel, comprising such coated substrate.

BACKGROUND AND SUMMARY

Inorganic oxide coatings, such as those based on silica, are commonly applied to a substrate. They can be used as single layer or as part of a multi-layer coating (or coating stack) to add a specific functionality to the substrate. Examples of such functional coatings or functional coating stacks are sodium-blocking coatings, oxygen-barrier coatings, hard coats, and optical coatings, e.g. anti-reflective coatings. The ability of these inorganic oxide coatings to maintain their functional performance during use is often crucial to the viability of technology relying on such coatings. In particular, the economic feasibility of solar panels is sensitive to the ability of the solar panels to maintain high functional performance (i.e. generate electrical or thermal energy from sun light) over an extended period. Significant improvements in functional performance of solar panels have been achieved through the application of anti-reflective (AR) coatings on the cover glass. Typical single layer AR coatings are thin porous silica layers, and have for example been described in EP0597490, U.S. Pat. No. 4,830,879, U.S. Pat. No. 5,858,462, EP1181256, WO2007/093339, WO2008/028640, EP1674891 and WO2009/030703.

These types of coatings, however, may be sensitive towards hydrolysis, making them less suitable for long-term outdoor application. Prolonged exposure to outdoor conditions typically leads to the formation of coating defects, and hence to a reduction in functionality and aesthetics of the coated substrate. Hydrolytic degeneration of the coating can be further accelerated by compounds that migrate from the substrate into the silica-based AR coating. In case of float glass, for example, sodium and calcium ions migrate into the coating, especially during thermal curing. These elements are known to accelerate hydrolytic degeneration of the silica coating.

One way to improve the hydrolytic stability of such porous silica coatings is the application of a topcoat. For example, US2008/0193635 discloses a process wherein a layer of amorphous diamond-like carbon is deposited on an anti-reflective coating to maintain efficient conversion of radiation in solar cells or panels. However, this technology requires the coating to be formed by anodization and consequently the process suffers from high cost and difficulties in scaling-up to the size required for meeting growing demand. Alternatively, more simple hydrophobic top coats can be applied to an AR coating, but such additional coating step still leads to increased production costs. In addition, this type of coating may deteriorate the aspired functionality. Furthermore, these coatings typically contain organic components such as fluoroalkyl compounds; the UV sensitivity of such compounds affecting durability of the coating stack.

A second approach to improve the hydrolytic stability is the application of a barrier film between the silica coating and the substrate, to reduce migration of alkali components; like a dense silica or mixed oxide layer. Such layer, however, also needs to be applied and cured in a separate coating step; leading to an increase in production costs. Additionally, such coating may be incompatible with the aspired functionality.

A further way to improve the hydrolytic stability of an inorganic oxide like silica is the addition of other elements, which replace part of the Si (or other) atoms in the network. It is known that a mixed oxide of silica and alumina shows improved resistance to hydrolysis; see for example R. K. Iler, The Chemistry of Silica, Wiley New York (1979). A disadvantage of this method is that mechanical properties may be negatively affected. Furthermore, addition of other inorganic oxide precursors like aluminum salts may reduce the stability of the coating composition prior to application; especially stability of a liquid coating composition comprising the inorganic oxide precursors for use in a so-called sol-gel process.

A sol-gel process, also known as chemical solution deposition, is a wet chemical technique that is typically used for making a (porous) inorganic oxide layer starting from a chemical compound in solution or colloid (or sol) form, which acts as precursor for forming an integrated network (or gel) of either discrete particles or network polymers. In such process, the sol gradually evolves to a gel-like diphasic system containing both a liquid and solid phase. Removing remaining liquid (drying) is generally accompanied by shrinkage and densification, and affects final microstructure and porosity. Afterwards, a thermal treatment at elevated temperature is often needed to enhance further condensation reactions (curing) and secure mechanical and structural stability. Typical inorganic oxide precursors are metal alkoxides and metal salts, which undergo various forms of hydrolysis and condensation reactions. Metal is understood to include silicium within the context of this description. To increase and control porosity and pore size, pore forming agents may be added (in addition to solvent). In processes for making an anti-reflective layer on a substrate generally coating compositions are applied that comprise only low amounts of components that will form the final solid layer, e.g. a solids content of up to about 10 mass %.

There is thus a need in industry for a coating composition that enables making an inorganic oxide coating on a substrate, like an anti-reflective layer on a transparent substrate, which coating shows improved hydrolytic stability.

It is therefore an objective of the present invention to provide such an improved coating composition.

The solution to the above problem is achieved by providing the composition and process as described herein below and as characterized in the claims.

Accordingly, the present invention provides a coating composition comprising:

an inorganic oxide precursor $A_{MOx}$ based on at least one inorganic element A selected from the group consisting of aluminum, silicium, titanium, zirconium, niobium, indium, tin, antimony, tantalum, and bismuth; and an inorganic oxide precursor $B_{MOx}$ based on at least one inorganic element B selected from the group consisting of scandium, yttrium, lanthanum, and the lanthanoids;

wherein $A_{MOx}$ and $B_{MOx}$ are capable of forming a mixed inorganic oxide.

With the coating composition of the invention an inorganic oxide coating can be made on a substrate, which coating unexpectedly shows improved hydrolytic stability compared to a coating not comprising element B or component $B_{MOx}$. The coating is thus able to retain its functional properties over an extended time while being subjected to variations in temperature and humidity. A further advantage of the coating composition of the invention, especially such liquid coating composition comprising solvent, is the (storage) stability of the coating liquid over time.

DETAILED DESCRIPTION

The coating composition according to the invention comprises an inorganic oxide precursor $A_{MOx}$ based on at least one inorganic element A selected from the group consisting of aluminum (Al), silicium (Si), titanium (Ti), zirconium (Zr), niobium (Nb), indium (In), tin (Sn), antimony (Sb), tantalum (Ta), and bismuth (Bi). These precursors can be formed into inorganic oxides in the form of a thin layer; i.e. a layer having a thickness of less than 500 nm, preferably less than 400, 300, 200 or even less than 150 nm. Preferably, such coating shows high transparency. The precursors are thus able to form a film layer, and preferably show good adhesion to the surface to which they are applied, also when other components like small particles are present. In the latter case, the precursor also acts as a matrix or binder material.

Preferably, the coating composition according to the invention comprises an inorganic oxide precursor $A_{MOx}$ based on at least one inorganic element A selected from the group consisting of aluminum, silicium, titanium, and zirconium; more preferably the precursor is based on silicium and/or aluminium as inorganic element A. In a special embodiment of the invention the composition contains an inorganic oxide precursor based on silicium, that is a silica precursor.

Suitable inorganic oxide precursors $A_{MOx}$ include those compounds that can react via hydrolysis and/or condensation reactions to form the corresponding oxide, as is well known in the art. The inorganic oxide precursor $A_{MOx}$ can be an inorganic salt or an organo-metallic compound, like an alkoxy, an aryloxy, a halogenide, a nitrate, a sulphate, and combinations thereof. Preferred precursors include alkoxides, like tetramethoxysilane (TMOS), tetraethoxysilane (TEOS), methyltrimethoxysilane, methyltriethoxysilane, titanium tetraisopropoxide, aluminium butoxide, and zirconium butoxide. More preferably, the at least one precursor comprises TMOS and/or TEOS. The inorganic oxide precursor may also be a mixture of inorganic oxide precursor compounds and corresponding inorganic oxide. Such mixture may for example result in case a precursor compound has been partially pre-reacted or pre-hydrolysed to form oligomeric species, typically in the form of nano-sized particles; a well known procedure in sol-gel technology.

The coating composition of the invention can also comprise a mixture of different inorganic oxide precursors $A_{MOx}$, in which case typically a mixed inorganic oxide is formed, as is known for e.g. different glasses. Although it is customary in the art to define the composition of such mixed inorganic oxide by amounts of different inorganic oxides, e.g. composition for an aluminosilicate made from Si- and Al-oxide precursors is typically expressed in silica and alumina contents, in such mixed oxide the elements are connected via oxygen atoms to form part of an ionic or covalent network, rather than that they are present in a physical mixture of different oxides. Within the context of the present disclosure, mixed inorganic oxide refers to such definition. Formation of a mixed oxide may e.g. be determined by assessing changes in iso-electric point of oxides—e.g in the form of thin layers—formed from different compositions, or by analytical techniques, like IR and solid-state NMR.

The coating composition according to the invention further comprises an inorganic oxide precursor $B_{MOx}$, which is based on at least one inorganic element B selected from the group consisting of scandium, yttrium, lanthanum, and the lanthanoids. The lanthanoids consist of the elements with atomic numbers 58-71; that is of cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Preferably, the composition of the invention comprises an inorganic oxide precursor $B_{MOx}$ based on at least one inorganic element B selected from the group consisting of scandium, yttrium, dysprosium, thulium, and lutetium; as these precursors showed high hydrolytic stability in inorganic oxide coatings, especially in combination with silica precursors. More preferably, the precursor $B_{MOx}$ is based on at least one inorganic element B selected from the group consisting of yttrium, dysprosium, thulium, and lutetium, most preferably the precursor $B_{MOx}$ is based on yttrium as inorganic element; i.e. an yttrium oxide precursor.

Suitable inorganic oxide precursors $B_{MOx}$ include compounds as defined above for inorganic oxide precursor $A_{MOx}$, alkoxides and nitrates being preferred. The precursors $A_{MOx}$ and $B_{MOx}$ being capable of forming a mixed inorganic oxide means that these compounds can co-react with each other, or with inorganic oxide already formed from a precursor, into a mixed inorganic oxide (as defined above).

In the coating composition according to the invention inorganic oxide precursors $A_{MOx}$ and $B_{MOx}$ can be pure compounds, but may also comprise other components that do not react or interfere with reactions occurring during coating formation, or otherwise have detrimental effects on coating performance. The precursors thus preferably comprise at least 80, 90, or 95 wt % of said inorganic oxides or precursors thereof.

In an embodiment of the invention the coating composition comprises 80 to 99.5 parts by weight of $A_{MOx}$; and 0.5 to 20 parts by weight of $B_{MOx}$ (based on 100 parts by weight of $A_{MOx}$ and $B_{MOx}$). In this composition range a distinct improvement in hydrolytic stability of a coating made from the composition results, without deteriorating other coating properties, such as mechanical properties like scratch resistance, or optical properties like transparency, colour or refractive index to an unacceptable extent. For this reason, the coating composition preferably comprises at least 1.0, 1.5, 2.0, 2.5 or 5 parts by weight of $B_{MOx}$, but at most 15, 12.5, 10, or 7.5 parts by weight $B_{MOx}$. For example in case an anti-reflective coating will be made from the composition, type and amount are preferably chosen such that the refractive index of a coating made from the composition does not change more than 0.2, more preferably not more than 0.15, or 0.1.

Alternatively, relative amounts of $A_{MOx}$ and $B_{MOx}$ are expressed in molar ratio of inorganic elements A and B in both precursors. In a preferred embodiment the coating composition comprises A and B in a molar ratio of from 100:1 to 1:2. More preferably, this molar ratio is at most 75, 50, 40, 30, 20 or 15:1, but at least 1:1, 2:1, 3:1, 4:1 or 5:1.

The coating composition of the present invention can be in solid or liquid form, or dispersed in one or more solvents.

In case the composition does not contain solvent, it is provided in such form that it can be applied to a substrate using a so-called dry application or deposition technique, like sputtering or chemical vapour deposition. A solvent containing or solvent borne coating composition can be applied to a substrate via wet application or deposition techniques; such as discontinuous methods like spin-coating and dip-coating, as well as continuous methods like spray-coating, roll-coating, slot die-coating, and the like.

The substrate on which the coating according to the invention can be applied can vary widely, and can be organic or inorganic and of various geometries. Preferably, the substrate is transparent for visible light. Suitable substrates include glasses (e.g. borosilicate glass, soda lime glass, glass ceramic, aluminosilicate glass) and plastics (e.g. PET, PC, TAO, PMMA, PE, PP, PVC and PS) or composite materials like laminates. Preferably the substrate is a glass, like borosilicate glass; preferably a flat glass like float glass with smooth or patterned surface.

The coating composition of the invention can be applied directly to the substrate, but also to another coating layer already present on the substrate; like a barrier layer for alkali ions, or an adhesion promoting layer.

In one embodiment of the invention, the coating composition is suited for being applied to a substrate via a wet application method, and the coating composition according to the invention further comprises at least one solvent. The inorganic oxide precursors may be dissolved in the solvent or dispersed in e.g. colloidal form. With solvent is meant a liquid component that contains the other coating components in dissolved, or dispersed or colloidal states depending on the nature of the precursor, and could thus also be referred to as diluent. Such coating composition will be referred to herein as a liquid coating composition or coating liquid. Such coating liquid is sometimes also called a sol, as is it typically made into a coating via a sol-gel process.

Depending on the nature of precursor compounds and other components optionally present, many solvents can be used in the composition of the invention, including non-protic and protic organic solvents like ketones, esters, ethers, alcohols, and mixtures thereof. Suitable examples include 1,4-dioxane, acetone, chloroform, cyclohexane, diethylacetate, propanol, ethanol, methanol, butanol, methyl ethyl ketone, methyl propyl ketone, tetrahydrofuran, toluene and tetrafluoroisopropanol. In embodiments applying sol-gel chemistry for making the coating, the organic solvent is miscible with water or can at least dissolve a certain amount of water. Preferably, a mixture of water and an alcohol is used as solvent. Preferred solvents are methanol, ethanol, iso-propanol or 1-methoxypropan-2-ol; more preferably comprising 0.1-10 wt % of water. Iso-propanol/water is specifically preferred.

The amount of solvent strongly determines the viscosity of the coating liquid, which is relatively low to allow application in thin films. Typically the viscosity of the optical coating formulation is about 0.2 mPa·s or more, preferably 1.0 mPa·s or more and even more preferably about 2.0 mPa·s or more. Generally, the viscosity is about 100 mPa·s or less, preferable about 50, or 10 mPa·s or less, more preferably about 6.0 mPa·s or less, and even more preferred about 3.0 mPa·s or less for making thin layers of homogeneous thickness. The viscosity can be measured with an Ubbelohde PSL ASTM IP no 1 (type 27042).

The liquid coating composition of the invention typically has a solids content of less than about 15 wt %, preferably less than 10 wt %; and a minimum solids content of about 0.1 wt %, preferably at least 0.2, 0.5 or 1.0 wt %.

In an embodiment of the invention, the coating composition can be made into a transparent coating, like a hard coat. Such hard coat composition may further comprise small particles, especially inorganic nano-particles as defined hereinafter; as is known to a skilled person for improving e.g. mechanical properties and hardness of the coating.

In a further embodiment the coating composition can be made into an anti-reflective coating. Typically, the reflection of a coated side of a substrate (e.g. glass) at the wavelength exhibiting a minimum is about 3% or less, preferably about 2% or less, and more preferably about 1% or less. The average reflection over a 425-675 nm wavelength range is generally about 4% or less, preferably about 3% or less, and more preferably about 2% or less.

A light reflection reducing or anti-reflective (AR) coating is a coating that reduces the reflection of light from a substrate at one or more wavelengths between 425 and 675 nm, as measured at an 85° incident angle. Measurements are carried out on the coated and uncoated substrate. Preferably the reduction in reflection is about 30% or more, preferably about 50% or more, more preferably about 70% or more, even more preferably about 85% or more. The reduction in reflection as expressed in a percentage is equal to 100× (reflection of the uncoated substrate−the reflection of the coated substrate)/(reflection of uncoated substrate).

The coating composition according to the invention, which is suited for a making an AR coating, preferably further comprises at least one pore forming agent, which helps in generating suitable porosity in the final AR layer to provide the desired refractive index, lower than that of the inorganic oxide and of the substrate. The coating composition may already contain solvent and organic ligands from organo-metallic precursor compounds, which compounds as such will already induce some porosity to the inorganic oxide layer. Preferably the composition comprises additional pore forming agents to enhance and control porosity and pore sizes. Suitable pore forming agents may be selected from the group consisting of organic compounds, organic polymers and inorganic particles having sub-micron particle size, i.e. inorganic nano-particles.

The coating composition may comprise organic compounds or polymers as pore forming additive; pores typically resulting from phase separation phenomena during sol-gel transitions. Organic compounds and polymers as pore forming agent may in initial stages after applying the coating composition to a substrate be present in dissolved, dispersed or other form. After drying the coating, these organics can be removed by known methods; for example by exposing the coating to a solvent for the polymer and extracting the polymer from the coating. Alternatively, a polymer can be removed during thermally curing the coating at temperatures above the decomposition temperature of the organic polymer. Suitable temperatures are from 350 to 900° C., preferably above 450, 500, 550 or 600° C. A combined treatment of dissolving and degrading/evaporating the compound or polymer may also be applied.

Suitable polymers as pore forming agent include those that can be removed from the coating, and provide a desired pore size of about 30-150 nm. Examples include polymers derived from a.o. styrenic, acrylic and olefinic monomers, including homopolymers and various copolymers. In U.S. Pat. No. 4,446,171 various suitable organic polymers are described, including PMMA, nitrocellulose, cellulose acetate butyrate, polyvinyl alcohol, and a hydroxyl-functional acrylic copolymer. Polyvinyl acetate was applied in U.S. Pat. No. 5,858,462. In EP0835849 polyethylene oxide was used as pore former.

In the coating composition according to the invention also inorganic nano-particles can be used as pore forming agent. Suitable nano-particles comprise at least one inorganic oxide or fluoride, or a precursor thereof. Examples of suitable particles are particles comprising lithium fluoride, calcium fluoride, barium fluoride, magnesium fluoride, titanium dioxide, zirconium oxide, antimony doped tin oxide, tin oxide, aluminum oxide, and silicon dioxide. Preferably, the inorganic oxide is alumina or silica. Preferably, the particles comprise silica, more preferably particles comprise at least 60 mass %, even more preferably at least 80 and most preferably at least 90 mass % silica.

The nano-particles can be of any suitable size, but preferably have an average particle size of below 500 nm, more preferably below 250, 125, 100, or 50 nm. Particle size is defined as 0.5×(length+width) for non-spherical particles and as the radius for spherical particles. Preferably, the average particle size is 5 nm or more, more preferably above 7 or above 10 nm. The sizes of the particles may be determined by spreading a dilute suspension of the particles over a surface and measuring the sizes of individual particles by using microscopic techniques, preferably scanning electronic microscopy (SEM) or atomic force microscopy (AFM) or a certain number—like 100—of dry particles, or by Dynamic Light Scattering (DLS) on dispersions.

The nano-particles may be solid, porous, or hollow. In case of solid particles, porosity in the coated layer results from spaces between non-ideally packed particles not being completely filled by the inorganic oxide matrix or binder. Preferably particles of different shapes, spherical, rod-like or worm-like, or of different particle size distributions are used. Examples of such coatings are for example described in U.S. Pat. No. 2,432,484 and EP1430001, and documents cited therein. Use of porous nano-particles in the coating composition will further contribute to controlling porosity in the cured coating.

In JP08122501 a liquid coating composition is described that can be made into an AR coating, and which composition comprises at least one compound selected from alkoxysilane compounds, metal alkoxides, and metal salts; organic solvent; and silica nano-particles of 5-30 nm. The metal alkoxide or salt can be selected from extensive lists, including yttrium compounds. In this publication no coating composition comprising yttrium, however, has been actually described or disclosed; and no effects on hydrolytic stability have been mentioned or suggested.

In a preferred embodiment of the invention the composition comprises hollow inorganic oxide nano-particles as pore forming agent. A hollow particle can also be described as a hollow core surrounded by an inorganic shell. Preferably, the particles have a void size larger than 1, or 3 nm, more preferably larger than 6 or 10 nm. Preferably, the hollow core is smaller than 250 nm, more preferably smaller than 100, 80, or even 70 nm. The void fraction is preferably at least about 5%, more preferably at least 10, 15, 25 or 25%; and at most about 90%, more preferably at most 70, 80, 60 or 50% of the volume of the particle. The void fraction (x) may be calculated according to equation $x=100\times(4\pi r_a^3/3)/(4\pi r_b^3/3)$, wherein $r_a$ is the radius of the core and $r_b$ is the radius of the outer shell (for a spherical particle).

Preferably the shell is at least 1 nm thick, more preferably at least 5, 10, 15 or 20 nm; and at most 75 nm thick, more preferably at most 50, 40, 30 or 25 nm thick.

In a further embodiment, the coating composition comprises core-shell nano-particles with an inorganic shell and an organic core, which core can be partly or completely removed—similarly to the organic compound or polymer as described above—to result in hollow particles. Preferably, the size of the organic core and inorganic shell is similar to the dimensions given for the hollow particles.

Core-shell nano-particles and their synthesis have been described in numerous publications, including reviews by Q. Zhang et al. in Nano Today 4, 494-507 (2009) and by Y. Ma et al. in J Coll. Interf. Sci 335, 1-10 (2009). Suitable particles have been disclosed in a.o. U.S. Pat. No. 5,100,471, U.S. Pat. No. 6,685,966, WO2008028640, WO2008028641, and WO2009030703, and in documents cited therein.

The organic core of the core-shell particle is preferably an organic polymer, which can be removed by solvent extraction, thermal degradation, catalytic decomposition, photo-degradation, electron beam or laser irradiation, and combinations thereof; typically followed by evaporating the degradation products. Core material may be removed, partially or virtually completely, before, during or after forming the composition into a coating. When the core material is removed before coating application, this may be achieved in any suitable manner at any suitable point in the production process. Preferably the core is removed after the particles have been added to a coating composition that is used in forming a coating. Therefore, the scope of the present invention encompasses coatings comprising core-shell particles wherein the core is present and also wherein the core has been partially or fully removed.

Suitable organic polymers include those which become labile at 600° C. or less, preferably at 450° C. or 350° C. or less. Preferably the polymers become labile at room temperature or higher, more preferably 150° C. or 250° C. or higher. Examples of suitable heat-labile polymers include polyesters, polyamides, polycarbonates, polyurethanes, vinyl polymers such as polystyrenes, poly(meth)acrylates and combinations thereof. Homopolymers, random co-polymers, block-copolymers, diblock-copolymers, multiblock-copolymers, and combinations thereof can be used. Suitable examples are given in WO2008/028640 on page 5, line 31 to page 7, line 5 which is incorporated herein by reference.

In a preferred embodiment of the invention the coating composition comprises inorganic nano-particles, wherein the inorganic nano-particle itself or the inorganic shell of a core-shell particle is based on inorganic oxide precursor $A_{MOx}$. The composition may be the same as the precursor compound in the composition, or different. Preferred compositions for nano-particles or shells of core-shell particles are similar as described earlier for the precursor compound. Preferably, the shell comprises silicon dioxide, more preferably the shell material comprises at least 60 wt %, more preferably at least 80 or 90 wt % silicon dioxide. In a special embodiment, the shell essentially consists of silica.

When such coating composition comprising inorganic nano-particles is made into a coating, mixed inorganic oxide will not only be formed as matrix or binder of the coating, but also mixed oxide may be formed from the precursors in at least a surface layer of the nano-particles, or in the shell of a core-shell particle. It is even to be expected that the particles will form part of the final network of matrix/binder.

The amount of nano-particles in the coating composition according to the invention is dependent on its use as coating and can vary widely. Based on 100% of solids, nano-particles content can be for example more than 50 wt %, preferably more than 60 or 70 wt % in the final coating. The concentration of solids or solids content is the content of all components that do not evaporate after the coating composition has been applied to the substrate and subsequent drying and, if required, curing steps.

The coating composition according to the invention may optionally comprise other non-volatile or solid components, preferably no more than 20%, more preferably no more than 10% and most preferably less than 5% by weight of the solid fraction. These components may be added to affect other functionalities of the coating or assist in the processing of the coating composition. Examples of other components include a further binder, buffer agents, catalysts, coupling agents, surfactants, chelating agents and leveling agents.

The coating composition according to the invention may also comprise a further binder, in addition to the inorganic oxide precursors. This further binder may co-react to form a network with the precursors, but also form a polymer or network on its own. Such additional binder may for example further improve mechanical properties of the resulting coating, or enhance adhesion to the substrate.

It is found that a liquid coating composition according to the invention shows good stability over time; i.e. the liquid can be stored at ambient conditions without significant changes in viscosity or size of dispersed particles; without the need to add a chelating agent or complexing ligand for the inorganic oxide precursors, especially for $B_{MOx}$. Nevertheless, in order to further increase storage stability and to avoid variation in rheological properties, the coating composition may further comprise a chelating agent. The chelating agent serves to defer network formation via hydrolysis of $B_{MOx}$ with $A_{MOx}$ or with the surface of nano-particles to after depositing a coating on a substrate, and subsequent drying and curing. This way the extent of reaction of $A_{MOx}$ and $B_{MOx}$ in the coating composition is even better controlled, such that the coating composition may be applied consistently and reproducibly, even after extended periods of storage.

Any suitable chelating agent may be used in the coating composition according to the invention, selection of type and quantity of chelating agent is within the knowledge of those skilled in the art. Suitable examples include ethylacetoacetate, 2,4-pentanedione (acetylacetone), 3,5-heptanedione, 4,6-nonanedione or 3-methyl-2,4-pentanedione (2-methylacetylacetone), and carboxylic acids like citric acid or lactic acid. Preferably acetylacetone is used as chelating agent. The molar ratio of chelating agent to inorganic oxide precursor can vary widely; for example form 5 to 0.1, preferably from 2 to 0.5, or 1.2 to 0.8.

It has further been found that modification of inorganic nano-particles, especially of core-shell particles with inorganic oxide precursor $B_{MOx}$ or element B, as described herein above may also be done on these particles in a separate step; that is not during the process of making a coating from a composition comprising such particles; to result in core-shell particles that have at least an outer layer or shell showing better hydrolysis resistance, offering advantages in various other uses of these particles as well.

The present invention therefore also relates to an inorganic nano-particle having at least an outer layer that comprises a mixed inorganic oxide based on inorganic oxide precursor $A_{MOx}$ and inorganic oxide precursor $B_{MOx}$, preferably to a core-shell nano-particle having an inorganic shell and an organic core, wherein the shell comprises a mixed inorganic oxide based on inorganic oxide precursor $A_{MOx}$ and inorganic oxide precursor $B_{MOx}$, as defined herein above. Core-shell particles are typically made using a sol-gel process, and the inventors assume that as a result thereof a shell layer is formed that has certain porosity, which shell is easily accessible to reaction with precursor $B_{MOx}$. Definitions and preferred embodiments for these modified nano-particles and core-shell particles correspond to those defined earlier for inorganic oxide precursors $A_{MOx}$ and $B_{MOx}$ in the present description. Such nano-particles, and especially core-shell particles can be used for several applications; including AR coatings, but also for other uses as mentioned in above-cited references.

The invention thus also relates to a coating composition comprising the core-shell particles according to the invention, and optionally at least one binder and at least one solvent.

In another embodiment, the present invention relates to a process for applying an inorganic oxide coating on a substrate comprising the steps of:
a) providing a coating composition according to the invention and as defined herein above;
b) applying the coating composition to the substrate.

The coating process is carried out with the objective of applying a coating of consistent thickness and optical properties across the substrate. The skilled person will know which equipment to select, as well as to choose proper conditions for coating, and optional drying and curing steps.

It is an advantage of the present invention that the coating is not particularly sensitive to moisture. Thus the coated substrate need not be stored in a humidity controlled environment; relative humidity variation between for example 30 and 80% is acceptable. Further, the inorganic coating also is not sensitive to time delays between coating and curing.

In case the coating composition of the present invention is in solid or liquid form, and does not contain solvent, a dry application or deposition technique, like sputtering or chemical vapour deposition can be used in the process of the invention. A solvent containing or solvent borne coating composition can be applied to a substrate with the process of the invention being a wet application or deposition techniques; such as discontinuous methods like spin-coating and dip-coating, as well as continuous methods like spray-coating, roll-coating, slot die-coating, and the like.

In a preferred embodiment of the invention, a liquid coating composition is applied via a wet application technique. The invention thus also relates to a process for applying an inorganic oxide coating on a substrate comprising the steps of:
a) providing a liquid coating composition according to the invention and as defined herein above;
b) applying the coating composition to the substrate;
c) drying the applied coating, and optionally,
d) curing the coating.

The coating or film layer applied in step b) comprises a solvent component, which is removed on drying in step c), thereby form a dry film, comprising the solids or film forming components of the coating composition. Evaporation can occur either under ambient conditions, or at reduced pressure and/or elevated temperature.

The drying step preferably takes place under ambient conditions, although elevated temperatures (e.g. above 40° C., preferably above 50° C.), optionally under reduced pressure, may also be used to shorten the total drying time. The exact drying conditions may be determined by a person skilled in the art based upon the solvent or diluting agent being evaporated.

The process according to the present invention may apply more than one coating layer, with intermediate drying performed after the application of each layer. In some embodiments, intermediate drying and curing is performed after applying some or all of the layers.

After drying, i.e. after substantially removing volatile components, the applied coating is preferably cured. Curing may be performed using a number of techniques including thermal curing, UV curing, electron beam curing, laser induced curing, gamma radiation curing, plasma curing, microwave curing and combinations thereof.

Curing conditions are depending on the coating composition and curing mechanism, and on the type of substrate. For example, in case of a glass substrate curing can be performed at relatively high temperatures; for example up to the softening temperature of the glass. This has the advantage that also organic compounds still present in the coated layer, like organic polymers present as pore forming agent as such or in a core-shell particle, can be thermally removed. A further advantage is that curing can be combined with a tempering step; i.e. heating the glass to about 630-700° C. followed by quenching, to result in toughened or safety glass.

In case the substrate is an organic polymer, curing temperature is limited to below the melting or softening point of the semi-crystalline or amorphous polymer. Based on the specific case, the skilled person will be able to determine suitable conditions.

Preferably the coating composition is applied to the substrate in a thickness eventually resulting in a thickness after drying or curing of about 20 nm or more, preferably of at least about 50 or 90 nm. Preferably, the applied coating layer has a thickness of less than about 1000 nm, more preferably of about at most about 500, 400, 300, or 200 nm.

In a preferred embodiment the applied coating is an anti-reflective coating, having thickness of at least about 50 or 90 nm and at most about 160 or 140 nm.

More specifically, the invention relates to a process for applying an inorganic oxide coating on a substrate comprising the steps of:
a) providing a liquid coating composition comprising
  an inorganic oxide precursor $A_{MOx}$ based on at least one inorganic element A selected from the group consisting of aluminum, silicon, titanium, zirconium, niobium, indium, tin, antimony, tantalum, and bismuth; and
  an inorganic oxide precursor $B_{MOx}$ based on at least one inorganic element B selected from the group consisting of scandium, yttrium, lanthanum, and the lanthanoids; wherein $A_{MOx}$ and $B_{MOx}$ are capable of forming a mixed inorganic oxide;
  at least one solvent;
  at least one pore forming agent;
b) applying the coating composition to the substrate;
c) drying the applied coating; and
d) curing the coating;
wherein preferred ways of performing the process and preferred compositions are as defined herein above.

In a further embodiment, the invention relates to a coated substrate obtained with the process according to the invention and as described herein above. Such coated substrate may be used in many different applications and end-uses, especially those wherein the coated layer is exposed to conditions that may cause hydrolysis of a coating layer; like window glazing or cover glass for solar modules.

More specifically, the invention relates to a substrate provided with a coating layer comprising a mixed inorganic oxide, made from an inorganic oxide precursor $A_{MOx}$ based on at least one inorganic element A selected from the group consisting of aluminum, silicium, titanium, zirconium, niobium, indium, tin, antimony, tantalum, and bismuth; and an inorganic oxide precursor $B_{MOx}$ based on at least one inorganic element B selected from the group consisting of scandium, yttrium, lanthanum, and the lanthanoids.

In an embodiment the coated substrate is provided with a coating layer according to the invention having anti-reflective properties; the coated substrate having a minimum reflection of less than 4% over a wavelength between 425 and 675 nm, preferably less than about 3%, or even less than about 2%.

In a further embodiment, the invention relates to an article comprising the coated substrate obtained with the process according to the invention. An example of such article includes solar panels, like a thermal solar panel or a photovoltaic module, comprising a coated substrate provided with a coating layer according to the invention and having anti-reflective properties.

As used herein, the term "by weight of the solid fraction" (wt %) refers to the weight percentage after removal of all solvent including water.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention will be further illustrated by the following examples, without being limited thereto.

Experiments

Optical Properties

Optical properties, including reflection, were measured by a spectrophotometer. The reflection performance was determined in the range of 350 to 800 nm using a Shimadzu UV-spectrophotometer UV-2401pc equipped with an integrating sphere for transmission and a specular reflectance (5° incident angle) for reflection measurements. Minimum reflection reported is the minimum value observed in this wavelength range.

Hydrolysis Resistance

Coated glass plates were subjected to the so-called damp/heat test (IEC 61215); reflection was measured before and after storing the plates at 85° C. and 85% relative humidity during 1000 hrs (85/85 test).

Comparative Experiment A

Core-shell particles were made in iso-propanol/water using acrylic copolymer latex (NeoCryl XK-30-DSM NeoResins BV, NL) as cationic template and tetramethoxysilane (TMOS) as silica precursor, according to the method described for Example 1 in WO2009/030703. The resulting dispersion had following properties:
pH after dilution with iso-propanol: 5.7
Particle size of latex in water (determined by DLS): 79 nm Particle size of core-shell particles in iso-propanol (by DLS): 95 nm
Polydispersity: <0.1
Isoelectric point: 4 to 5
Nitric acid was then added to result in pH 3.6. The resulting dispersion contains about 3 wt % of core-shell particles.

To a solution of tetraethoxisilane (TEOS) in iso-propanol a molar excess of water was added to pre-hydrolyse the silane compound. After cooling back to room temperature acetic acid was added, and after 24 hrs stirring more iso-propanal and nitric acid were added. The resulting dispersion contained about 4 wt % of silica particles of about 3-5 nm size.

A coating composition was prepared by mixing 87.4 g of the core-shell particles dispersion with 27.4 g of said TEOS dispersion, 10 g of water and 70 g iso-propanol (under ambient conditions). Solids content of this composition was about 2.9 wt %.

At least 5 glass plates of 500×500×2 mm were dip-coated with this composition using a withdrawal speed of 3.5 mm·s$^{-1}$, and cured at 650° C. during 2.5 min. The coated glass plates had an average reflection of less than 1% in the range of 425 to 675 nm. After measuring reflection, the coated plates were subjected to the 85/85 test. Reflection characteristics were measured again after 1000 hours of exposure; minimum reflection is reported in Table 2.

Comparative Experiment B

CE A was repeated, but now also 1.5 g of Al(NO$_3$)$_3$.9H$_2$O was added to the mixture, and stirred during at least 16 hours. The stability of the resulting liquid coating composition was followed over time by measuring the average particle size (of the core-shell particles) with Dynamic Light Scattering. In Table 1 results are summarized as the relative change in particle size (initial value about 96 nm). It can be clearly seen that addition of Al-salt results in significant increase in particle size in the coating composition. Such particle size growth over time results in an increased viscosity, which may deteriorate anti-reflective properties of a coating made from such aged composition, and the ability to apply the coating solution with high consistency to a substrate.

Presence of Al-salt as precursor in the coating composition does result in improved hydrolytic stability of the coating made therefrom, as is demonstrated by results collected in Table 2.

Examples 1-6

CE B was repeated, but now 1.5 g was added of nitrate hydrate salts of thulium, yttrium, dysprosium, gadolinium, neodymium, and lutetium, respectively. The compositions containing yttrium or lanthanoid salt show markedly better stability than the coating liquids containing alumina (CE B), and similar behaviour to reference CE A (no metal salt added); see Table 1.

The coating compositions were assessed for hydrolytic stability, and results are given in Table 2. The molar ratio Si/B reflects the ratio of Si in the composition, originating both from TMOS in the core-shell particles and TEOS in the binder, and metal salt added. It can be seen that addition of yttrium and lanthanoids all result in improved hydrolytic stability relative to unmodified silica-based coating. Presence of yttrium, lutetium, thulium and dysprosium salts also result in coatings with better hydrolytic stability relative to the coating formulation containing aluminum nitrate.

TABLE 1

| Experiment | Nitrate salt | 2 days | 33 days | 51 days |
|---|---|---|---|---|
| A | — | 0% | 6% | 12% |
| B | Alumina | 2% | 23% | 26% |
| 1 | Thulium | 2% | 6% | 14% |
| 2 | Yttrium | 2% | 10% | 12% |
| 3 | Dysprosium | 1% | 9% | 11% |
| 4 | Gadolinium | 0% | 10% | 14% |
| 5 | Neodymium | 2% | 12% | 16% |
| 6 | Lutetium | 0% | 10% | 12% |

TABLE 2

| | | Si/B | Minimum reflection (%) before/after 85/85 test | |
|---|---|---|---|---|
| Exp. | Nitrate salt | molar ratio | 0 h | 1000 h |
| A | — | — | 0.43 | 3.24 |
| B | Alumina | 9.8 | 0.42 | 1.73 |
| 1 | Thulium | 12.1 | 0.23 | 0.90 |
| 2 | Yttrium | 10.0 | 0.73 | 0.69 |
| 3 | Dysprosium | 11.9 | 0.33 | 1.30 |
| 4 | Gadolinium | 11.8 | 0.38 | 2.28 |
| 5 | Neodymium | 11.5 | 0.37 | 2.40 |
| 6 | Lutetium | 12.3 | 0.36 | 1.23 |

The invention claimed is:

1. A coating composition comprising:
   an inorganic metal oxide precursor A$_{MOx}$ based on at least one inorganic metal element A selected from the group consisting of aluminum, silicon, titanium, zirconium, niobium, indium, tin, antimony, tantalum, and bismuth;
   an inorganic metal oxide precursor B$_{MOx}$ based on at least one inorganic metal element B selected from the group consisting of scandium, yttrium, lanthanum, and the lanthanoids; and
   core-shell nanoparticles as a pore forming agent, wherein the nanoparticles have an inorganic shell and an organic core, and wherein
   the inorganic metal oxide precursors A$_{MOx}$ and B$_{MOx}$ are capable of forming a mixed inorganic oxide, and wherein
   the coating composition comprises 80 to 99.5 parts by weight of the inorganic metal oxide precursor A$_{MOx}$, and 0.5 to 20 parts by weight of the inorganic metal oxide precursor B$_{MOx}$ based on 100 parts by weight of the inorganic metal oxide precursors A$_{MOx}$ and B$_{MOx}$, and wherein
   the coating composition is anti-reflective.

2. The coating composition according to claim 1, wherein the at least one inorganic metal element A is selected from the group consisting of aluminum, silicon, titanium, and zirconium.

3. The coating composition according to claim 1, wherein the inorganic metal oxide precursor A$_{MOx}$ is based on silicium.

4. The coating composition according to claim 1, wherein the at least one inorganic metal element B is selected from the group consisting of scandium, yttrium, dysprosium, thulium, and lutetium.

5. The coating composition according to claim 1, wherein the inorganic metal oxide precursor B$_{MOx}$ is based on yttrium.

6. The coating composition according to claim 1, which comprises 85-99.0 parts by weight of the inorganic metal oxide precursor A$_{MOx}$ and 1.0 to 15 0.5 to 20 parts by weight of inorganic metal oxide precursor $B_{MOx}$ based on 100 parts by weight of the inorganic metal oxide precursors $A_{MOx}$ and $B_{MOx}$.

7. The coating composition according to claim 1, wherein the coating composition comprises the inorganic metal elements A and B in a molar ratio of the inorganic metal element A to the inorganic metal element B from 100:1 to 1:2.

8. The coating composition according to claim 1, further comprising at least one solvent.

9. The coating composition according to claim 1, wherein the inorganic shell of the core-shell nanoparticles is based on the inorganic oxide precursor $A_{MOx}$.

10. A process for applying an inorganic oxide coating on a substrate comprising the steps of:
   a) providing a coating composition according to claim 1;
   b) applying the coating composition to the substrate.

11. The process according to claim 10, comprising the steps of
   a) providing a liquid coating composition;
   b) applying the coating composition to the substrate;
   c) drying the applied coating, and optionally,
   d) curing the coating.

* * * * *